(12) United States Patent
So

(10) Patent No.: US 11,978,828 B2
(45) Date of Patent: May 7, 2024

(54) DISPLAY PANEL AND DISPLAY DEVICE

(71) Applicant: LG Display Co., Ltd., Seoul (KR)

(72) Inventor: Byeong-Seong So, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 450 days.

(21) Appl. No.: 17/467,991

(22) Filed: Sep. 7, 2021

(65) Prior Publication Data
US 2022/0209068 A1 Jun. 30, 2022

(30) Foreign Application Priority Data
Dec. 30, 2020 (KR) .......................... 10-2020-0188379

(51) Int. Cl.
| | | |
|---|---|---|
| H01L 33/38 | (2010.01) | |
| H01L 27/15 | (2006.01) | |
| H01L 33/44 | (2010.01) | |
| H01L 33/62 | (2010.01) | |
| H01Q 1/24 | (2006.01) | |

(52) U.S. Cl.
CPC .......... H01L 33/382 (2013.01); H01L 27/156 (2013.01); H01L 33/44 (2013.01); H01L 33/62 (2013.01); H01Q 1/243 (2013.01)

(58) Field of Classification Search
CPC ..... H01L 33/382; H01L 27/156; H01L 33/44; H01L 33/62; H01L 25/167; H01L 33/38; H01L 27/124; H01Q 1/243; H01Q 1/22; H01Q 1/40; H01Q 1/364; H01Q 1/38; H10K 50/822; H10K 59/00; H10K 59/131; H10K 59/353; H10K 59/60; H10K 50/805; H10K 59/12; H10K 50/81; H10K 59/1213; H10K 59/124; H10K 59/126
USPC .......................................................... 257/79
See application file for complete search history.

(56) References Cited

U.S. PATENT DOCUMENTS

2020/0393936 A1* 12/2020 Bok ...................... H10K 59/131

* cited by examiner

*Primary Examiner* — Karen Kusumakar
*Assistant Examiner* — Shawn Shaw Muslim
(74) *Attorney, Agent, or Firm* — Fenwick & West LLP

(57) ABSTRACT

Embodiments of the present disclosure relate to a display panel and a display device. The display panel comprises a substrate including a first display area and a second display area each having a plurality of sub-pixels, wherein the number of sub-pixels per unit area in the first display area is less than the number of sub-pixels per unit area in the second display area; a transistor layer disposed over the substrate and including a plurality of transistors; a planarization layer over the transistor layer; a light emitting element layer including a common electrode including a plurality of holes in the first display area, disposed over the planarization layer, and including a plurality of light emitting elements; and an antenna comprising a first antenna electrode disposed in the transistor layer and a second antenna electrode disposed over the first antenna electrode, disposed in the first display area and at least a part of which overlaps the plurality of holes. In the present disclosure, the reception rate of the antenna is improved.

14 Claims, 10 Drawing Sheets

DISPLAY PANEL AND DISPLAY DEVICE

CROSS-REFERENCE TO RELATED APPLICATION

This application claims priority from Korean Patent Application No. 10-2020-0188379, filed on Dec. 30, 2020, which is hereby incorporated by reference for all purposes as if fully set forth herein.

BACKGROUND

1. Field of the Invention

Embodiments of the present disclosure relate to a display panel and a display device.

2. Description of the Related Art

A display device that combines wireless communication includes an antenna for receiving signals. The antenna for signal reception may be located under the display panel of the display device or in a non-display area of the display panel.

In terms of product aesthetics and practicality, display devices tend to minimize the non-display area and maximize the display area. However, since there is a limit to miniaturization of an antenna for signal reception, it is difficult to reduce the non-display area and increase the display area when the antenna is located in the non-display area.

If the antenna is located in the display area, the space occupied by the antenna in the non-display area can be used as a display area, but the electrode formed in the display area for displaying an image interferes with the antenna's signal reception.

SUMMARY

Embodiments of the present invention provide a display panel and display device which comprise a common electrode including a plurality of holes in a first display area and an antenna positioned so as to at least partially overlap the plurality of holes, the antenna being built into the display panel, and have an improved antenna reception rate.

In an aspect, embodiments of the present disclosure provide a display panel including a substrate, a transistor layer over the substrate, a planarization layer over the transistor layer, a light emitting element layer over the planarization layer, and an antenna. The substrate includes a first display area and a second display area each having a plurality of sub-pixels. The number of sub-pixels per unit area in the first display area is less than the number of sub-pixels per unit area in the second display area. The transistor layer includes a plurality of transistors. The light emitting element layer includes a common electrode and includes a plurality of light emitting elements. The common electrode includes a plurality of holes in the first display area. The antenna is positioned in the first display area and positioned so as to at least partially overlap the plurality of holes. The antenna includes a first antenna electrode and a second antenna electrode positioned over the first antenna electrode. The first antenna electrode is located in the transistor layer.

The transistor layer may include a first opaque conductive layer positioned in the first display area.

The first opaque conductive layer may not overlap a plurality of holes, and the first antenna electrode may be in contact with the first opaque conductive layer in the first display area.

The transistor layer may include a light blocking layer positioned to at least partially overlap the light emitting element.

The first opaque conductive layer may be formed of the same material as the light blocking layer.

The light emitting element layer may include a pixel electrode positioned under the common electrode.

The second antenna electrode may be positioned in the light emitting element layer and may be formed of the same material as the pixel electrode.

The planarization layer may include a second opaque conductive layer positioned in the first display area.

The second opaque conductive layer may not overlap the plurality of holes, and the second antenna electrode may be in contact with the second opaque conductive layer in the first display area.

The planarization layer may include a source-drain electrode pattern electrically connected to the transistor, and the second opaque conductive layer may be formed of the same material as the source-drain electrode pattern.

The second opaque conductive layer may include a first portion and a second portion. The first portion may correspond to an edge of the plurality of holes in the first display area, and the second portion may connect the first portions.

The second antenna electrode may be located in the transistor layer.

The transistor layer may include a third opaque conductive layer positioned in the first display area. The third opaque conductive layer does not overlap with the plurality of holes. The second antenna electrode may be in contact with the third opaque conductive layer in the first display area.

The plurality of transistors may include a gate, and the third opaque conductive layer may be formed of the same material as the gate.

The third opaque conductive layer may include a third portion corresponding to an edge of the plurality of holes and a fourth portion connecting the third portions.

In another aspect, embodiments of the present disclosure provide a display device including the display panel and a light receiving device. The display panel comprises a substrate including a first display area and a second display area each having a plurality of sub-pixels, wherein the number of sub-pixels per unit area in the first display area is less than the number of sub-pixels per unit area in the second display area; a transistor layer disposed over the substrate and including a plurality of transistors; a planarization layer over the transistor layer; a light emitting element layer including a common electrode including a plurality of holes in the first display area, disposed over the planarization layer, and including a plurality of light emitting elements; and an antenna comprising a first antenna electrode disposed in the transistor layer and a second antenna electrode disposed over the first antenna electrode, disposed in the first display area and at least a part of which overlaps the plurality of holes, wherein the light receiving device is located under the substrate and at least partially overlaps the first display area.

According to embodiments of the present disclosure, a display panel and a display device can be provided of which the antenna signal can be effectively received by including a common electrode including a plurality of holes in the first display area, and including an antenna positioned to overlap the plurality of holes.

DETAILED DESCRIPTION

Figure 1:
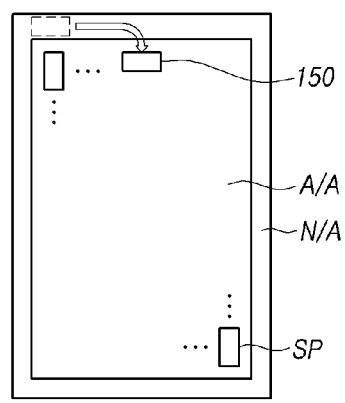
FIG. 1 illustrates a display panel according to embodiments of the present disclosure.

FIG. 1 illustrates a display panel according to embodiments of the present disclosure.

Referring to FIG. 1, a display panel 100 according to embodiments of the present disclosure may include an active area A/A and a non-active area N/A.

The sub-pixel SP is located in the active area A/A, so that brightness can be expressed according to an applied signal.

The display panel 100 may include an antenna 150. Although the antenna 150 may be located in the non-active area N/A, the area of the active area A/A is increased and the area of the non-active area N/A is narrowed according to technological development. Accordingly, it is difficult to position the antenna 150 in the non-active area N/A.

Accordingly, in the display panel 100 according to embodiments of the present disclosure, the antenna 150 is located in the active area A/A. However, when the antenna 150 is located in the active area A/A, since a plurality of sub-pixels SP are located in the active area A/A, the signal reception of the antenna 150 may not be effectively performed due to the wiring of circuits such as light emitting elements constituting the sub-pixels SP.

Figure 2:
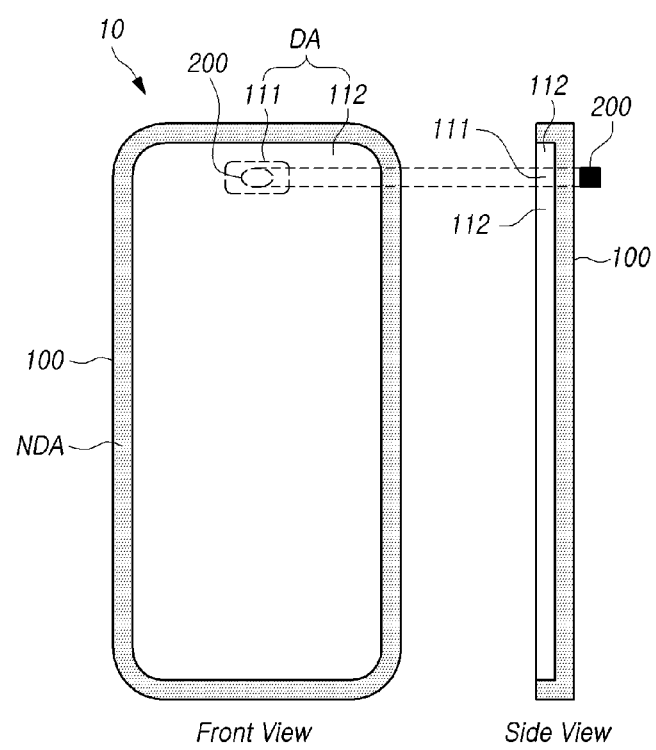
FIG. 2 illustrates a display device according to embodiments of the present disclosure.

FIG. 2 illustrates a display device according to embodiments of the present disclosure.

Referring to FIG. 2, the display device 10 according to embodiments of the present disclosure may include a display panel 100 for displaying an image and a light receiving device 200 for receiving light.

The display panel 100 may include a substrate, and a plurality of insulating layers, transistor layers and light emitting element layers over the substrate.

The display panel 100 may include a plurality of sub-pixels for imaging display and various signal lines for driving the plurality of sub-pixels. The signal lines may include a plurality of data lines, a plurality of gate lines, a plurality of power lines, and the like. Here, each of the plurality of sub-pixels may include a transistor positioned in the transistor layer and a light emitting element positioned in the light emitting element layer.

The display panel 100 may include a display area DA where an image is displayed and a non-display area NDA that is an area outside the display area DA. A plurality of sub-pixels may be disposed in the display area DA. Various signal lines may be disposed in the non-display area NDA and a driving circuit may be connected thereto. The non-display area NDA may be bent so that it cannot be seen from the front or may be covered by a case (not shown), and is also referred to as a bezel.

Figure 6:
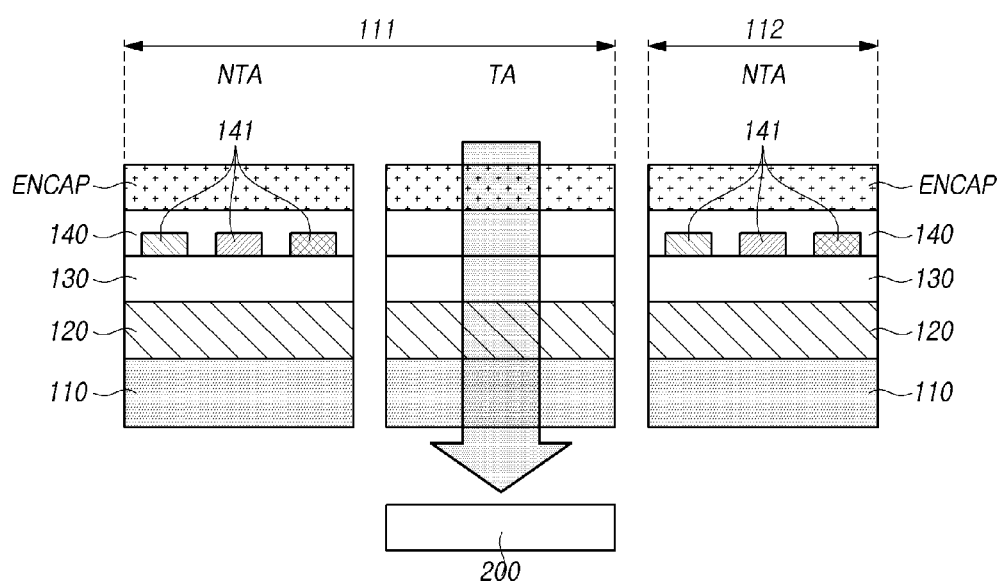
FIG. 6 is a cross-sectional view of a display panel according to embodiments.

Referring to FIG. 6, the display area DA may include a first display area 111 and a second display area 112.

The light receiving device 200 is a device that receives light and performs a predetermined function. For example, the light receiving device 200 may include one or more of a camera and a proximity sensor.

The light receiving device 200 is a device that requires light reception, but may be located behind (below) the display panel 100. That is, the light receiving device 200 may be located opposite the viewing plane of the display panel 100. The light receiving device 200 is not exposed from the front side of the display device 10. Accordingly, when the user looks at the front of the display panel 100, the light receiving device 200 is not visible.

The camera located behind (below) the display panel 100 is a front camera that takes a picture of the front, and can also be viewed as a camera lens.

Referring to FIG. 2, the light receiving device 200 may be disposed to at least partially overlap the display area DA of the display panel 100. That is, the light receiving device 200 may be located in the display area DA.

An area at least partially overlapping the light receiving device 200 in the display area DA is referred to as a first display area 111 and the remaining area is referred to as a second display area 112. Accordingly, the light receiving device 200 may be positioned to at least partially overlap the first display area 111 in the display area DA. In other words, it can be seen that the light receiving device 200 is located in the first display area 111 in the display area DA.

Since the first display area 111 in the display area DA at least partially overlaps the light receiving device 200, the transmittance of the first display area 111 in the display area DA should be higher than the transmittance of the second display area 112 not overlapping the light receiving device 200.

In order to improve the transmittance of the first display area 111 overlapping the light receiving device 200, resolution, sub-pixel arrangement structure, number of sub-pixels per unit area, electrode structure, wiring structure, electrode arrangement structure, or wiring arrangement and the like may be different from each other in the first display area 111 and the second display area 112.

For example, the number of sub-pixels per unit area in the first display area 111 may be smaller than the number of sub-pixels per unit area in the second display area 112. Accordingly, the resolution of the first display area 111 may be lower than that of the second display area 112.

In the display device 10 according to embodiments of the present disclosure, the camera as the light receiving device 200 positioned below the display panel 100 without being exposed to the outside is also referred to as a UDC (Under Display Camera).

The display device 10 according to the embodiments of the present disclosure may have a smaller bezel, and the notch-shaped display panel 100 may not be manufactured. In addition, design restrictions due to the light receiving device 200 are eliminated, so the exterior design is more free.

In the display device 10 according to embodiments of the present disclosure, the light receiving device 200 should normally perform a predetermined function by receiving light normally although the light receiving device 200 is positioned behind the display panel 100. Also, in the display device 10 according to embodiments of the present disclosure, the light receiving device 200 should be able to normally receive light and perform a predetermined function although the light receiving device 200 is positioned behind the display panel 110 and overlaps the display area DA, and it should be possible to display a normal image in the display area DA.

Accordingly, the display device 10 according to the embodiments of the present disclosure provides a structure capable of improving the transmittance of the first display area 111 overlapping the light receiving device 200.

Figure 3:
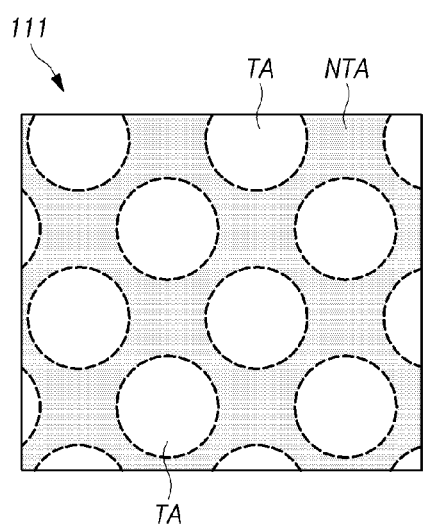
FIGS. 3 and 4 are top views of a first display area of a display panel according to embodiments.
Figure 4:
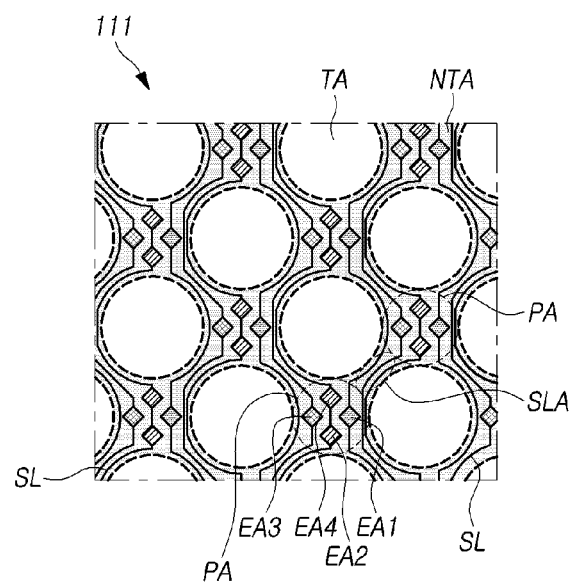

Referring to FIGS. 3 and 4, the first display area 111 is an area at least partially overlapping the light receiving device 200. The first display area 111 may include a non-transmissive area NTA and a transmissive area TA.

Referring to FIGS. 3 and 4, the transmissive area TA is a partial area included in the first display area 111, and may be an area through which external light is transmitted to the light receiving device 200. For example, the transmission area TA may have a circular or elliptical shape, and may also be referred to as a hole area.

Referring to FIGS. 3 and 4, the non-transmissive area NTA is a partial area included in the first display area 111, and may be a region in which transistors of the transistor layer and light emitting elements of the light emitting element layer are located.

Referring to FIGS. 3 and 4, the non-transmissive area NTA may includes a pixel area PA in which the light emitting areas EA1, EA2, EA3, and EA4 of the sub-pixels exist and a wiring area SLA in which a signal line SL is disposed.

Referring to FIGS. 3 and 4, when the transmissive area TA is surrounded by the non-transmissive area NTA, the first display area 111 may includes a plurality of transmissive areas TA separated from each other.

Figure 5:
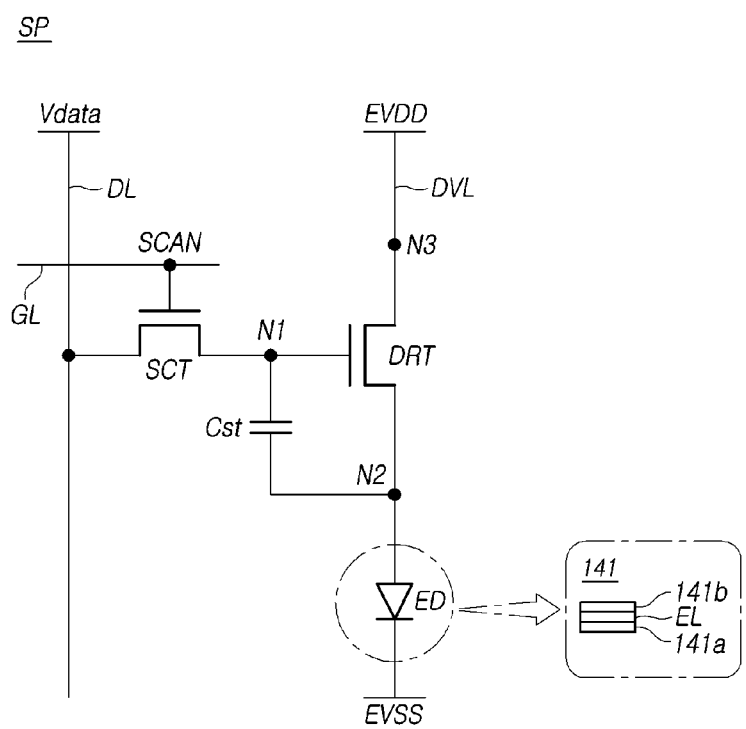
FIG. 5 is an equivalent circuit diagram of a sub-pixel according to embodiments of the present disclosure.

FIG. 5 is an equivalent circuit of a sub-pixel SP of the display device 10 according to embodiments of the present disclosure.

Referring to FIG. 5, each of the plurality of sub-pixels SP disposed over the display panel 100 of the display device 10 according to embodiments of the present disclosure includes a light emitting element ED 141, a driving transistor DRT, a scan transistor SCT, and a storage capacitor Cst.

The light emitting element 141 may include a pixel electrode 141b, a common electrode 141a, and a light emitting layer EL positioned between the pixel electrode 141b and the common electrode 141a. The pixel electrode 141b may be disposed in each sub-pixel SP, and the common electrode 141a may be disposed in common to the plurality of sub-pixels SP. The pixel electrode 141b may be an opaque reflective electrode, and the common electrode 141a may be a semi-transparent electrode. For example, the pixel electrode 141b may be an anode electrode, and the common electrode 141a may be a cathode electrode. For another example, the pixel electrode 141b may be a cathode electrode, and the common electrode 141a may be an anode electrode. For example, the light emitting element 141 may be an organic light emitting diode OLED, a micro light emitting diode, or a quantum dot light emitting element.

The driving transistor DRT is a transistor for driving the light emitting element 141, and may include a first node N1, a second node N2, a third node N3, and the like.

The first node N1 of the driving transistor DRT may be a gate node of the driving transistor DRT, and may be electrically connected to a source node or a drain node of the scan transistor SCT. The second node N2 of the driving transistor DRT may be a source node or a drain node of the driving transistor DRT, and may also be electrically connected to the pixel electrode 141b of the light emitting element 141, and the common electrode 141a of the light emitting element 141 may be connected with the non-driving voltage EVSS. The third node N3 of the driving transistor DRT may be electrically connected to the driving voltage line DVL supplying the driving voltage EVDD.

The scan transistor SCT is controlled by the scan signal SCAN and may be connected between the first node N1 of the driving transistor DRT and the data line DL. The scan transistor SCT is turned on or turned off according to the scan signal SCAN supplied from the gate line GL, and control the connection between the data line DL and the first node N1 of the driving transistor DRT.

The scan transistor SCT is turned on by the scan signal SCAN having a turn-on level voltage, so that it can transmit the data voltage Vdata supplied from the data line DL to the first node N1 of the driving transistor DRT.

The turn-on level voltage of the scan signal SCAN capable of turning on the scan transistor SCT may be a high level voltage or a low level voltage. The turn-off level voltage of the scan signal SCAN capable of turning off the scan transistor SCT may be a low level voltage or a high level voltage. For example, when the scan transistor SCT is an n-type transistor, the turn-on level voltage may be a high level voltage and the turn-off level voltage may be a low level voltage. As another example, when the scan transistor SCT is a p-type transistor, the turn-on level voltage may be a low level voltage and the turn-off level voltage may be a high level voltage.

Each of the driving transistor DRT and the scan transistor SCT may be an n-type transistor or a p-type transistor.

The storage capacitor Cst may be connected between the first node N1 and the second node N2 of the driving transistor DRT. The storage capacitor Cst is charged with an amount of charge corresponding to the voltage difference between both ends, and serves to maintain the voltage difference between both ends for a predetermined frame time. Accordingly, during a predetermined frame time, the corresponding sub-pixel SP may emit light.

The storage capacitor Cst is not a parasitic capacitor (eg, Cgs, Cgd), which is an internal capacitor existing between the gate node and the source node (or drain node) of the driving transistor DRT, but it may be an external capacitor intentionally designed outside the driving transistor DRT.

The sub-pixel SP of the display device 10 according to embodiments of the present disclosure may further include one or more transistors or may further include one or more capacitors.

FIG. 6 shows a cross-sectional structure of a non-transmissive area NTA in a first display area 111, a transmissive area TA in the first display area 111, and a cross-sectional structure of a second display area 112 in the display device 10 according to embodiments of the present disclosure.

Referring to FIG. 6, the first display area 111 of the display panel may include a transmissive area TA and a non-transmissive area NTA. The second display area 112 of the display panel may be a non-transmissive area NTA.

FIG. 6 shows the stacked structure of the non-transmissive area NTA in the first display area 111, the stacked structure of the transmissive area TA in the first display area 111, and the stacked structure of the second display area 112.

Referring to FIG. 6, the stacked structure of the second display area 112 is as follows.

In the second display area 112, a transistor layer 120 is disposed over a substrate 110, a planarization layer 130 is disposed over the transistor layer 120, and a light emitting element layer 140 is disposed over the planarization layer 130, and an encapsulation layer ENCAP may be disposed over the light emitting element layer 140.

In the second display area 112, transistors such as a driving transistor DRT and a scan transistor SCT of each sub-pixel SP may be disposed in the transistor layer 120, and various insulating layers for forming the transistors may be disposed. The various insulating layers may include an organic layer and an inorganic layer.

In the second display area 112, various wirings such as a data line DL, a gate line GL, and a driving voltage line DVL may be disposed in the transistor layer 120.

In the second display area 112, the light emitting element 141 of each sub-pixel SP may be disposed in the light emitting element layer 140. Accordingly, in the second display area 112, the pixel electrode 141b, the light emitting layer EL, and the common electrode 141a constituting the light emitting element 141 may be disposed in the light emitting element layer 140.

Referring to FIG. 6, the stacked structure of the non-transmissive area NTA in the first display area 111 is the same as that of the second display area 112.

In the non-transmissive area NTA of the first display area 111, the transistor layer 120 is disposed over the substrate 110, the planarization layer 130 is disposed over the transistor layer 120, and the light emitting element layer 140 is disposed over the layer 130, and an encapsulation layer ENCAP may be disposed over the light emitting element layer 140.

The light emitting element 141 is vulnerable to moisture or oxygen. The encapsulation layer ENCAP may prevent penetration of moisture or oxygen, thereby preventing the light emitting element 141 from being exposed to moisture or oxygen. The encapsulation layer ENCAP may be formed of one layer or a plurality of layers.

In the non-transmissive area NTA of the first display area 111, transistors such as a driving transistor DRT and a scan transistor SCT of each sub-pixel SP may be disposed in the transistor layer 120, and various insulating layers for forming the transistors may be disposed. The various insulating layers may include an organic layer and an inorganic layer.

In the non-transmissive area NTA of the first display area 111, various lines such as a data line DL, a gate line GL, and a driving voltage line DVL may be disposed in the transistor layer 120.

In the non-transmissive area NTA of the first display area 111, the light emitting element 141 of each sub-pixel SP may be disposed in the light emitting element layer 140. Accordingly, in the non-transmissive area NTA of the first display area 111, the pixel electrode 141b, the light emitting layer EL, and the common electrode 141a constituting the light emitting element 141 may be disposed in the light emitting element layer 140.

Referring to FIG. 6, the stacked structure of the transmissive area TA in the first display area 111 is as follows.

Referring to FIG. 6, in the transmissive area TA of the first display area 111, the transistor layer 120 is disposed over the substrate 110, and the planarization layer 130 is disposed over the transistor layer 120, the light emitting element layer 140 is disposed over the planarization layer 130, and the encapsulation layer ENCAP may be disposed over the light emitting element layer 140.

In the non-transmissive area NTA of the first display area 111, the transistor layer 120 includes transistors such as the driving transistor DRT and the scan transistor SCT of each sub-pixel SP and various wirings. The light emitting element 141 of each sub-pixel SP may be disposed in the light emitting element layer 140.

In the transmission area TA of the first display area 111, transistors and wirings are not disposed in the transistor layer 120. However, in the transmissive area TA of the first display area 111, various insulating layers necessary for forming the transistor may be disposed in the transistor layer 120. The various insulating layers may include an organic layer and an inorganic layer.

In the transmissive area TA of the first display area 111, the light emitting element 141 of each sub-pixel SP is not disposed in the light emitting element layer 140. Accordingly, the pixel electrode 141b, the light emitting layer EL, and the common electrode 141a are not disposed in the light emitting element layer 140 in the transmissive area TA of the first display area 111. In some cases, only some of the pixel electrode 141b, the light emitting layer EL, and the common electrode 141a may be disposed in the light emitting element layer 140 in the transmissive area TA in the first display area 111. For example, in the transmissive area TA of the first display area 111, only the light emitting layer EL may be disposed in the light emitting element layer 140.

Referring to FIG. 6, among the metal material layer and the insulating material layer disposed in the non-transmissive area NTA of the first display area 111 and the second display area 112, the metal material layer is not disposed in the transmission area TA of the first display area 111. However, among the metal material layer and the insulating material layer disposed in the non-transmissive area NTA of the first display area 111 and the second display area 112, the insulating material layer can be extended to the transmissive area TA of the first display area 111.

In other words, the metal material layer is disposed in the non-transmissive area NTA of the first display area 111 and the non-transmissive area NTA of the second display area 112, and it is not disposed in the transmissive area TA of the first display area 111. The insulating material layer may be disposed in common in the non-transmissive area NTA of the first display area 111, the non-transmissive area NTA of the second display area 112, and the transmissive area TA of the first display area 111.

Referring to FIG. 6, the transmission area TA in the first display area 111 of the display panel 100 may partially overlap the light receiving device 200.

External light is transmitted to the light receiving device 200 through the transmission area TA in the first display area 111. Therefore, for the normal operation of the light receiving device 200, the transmittance of the transmissive area TA in the first display area 111 should be high.

Figure 7:
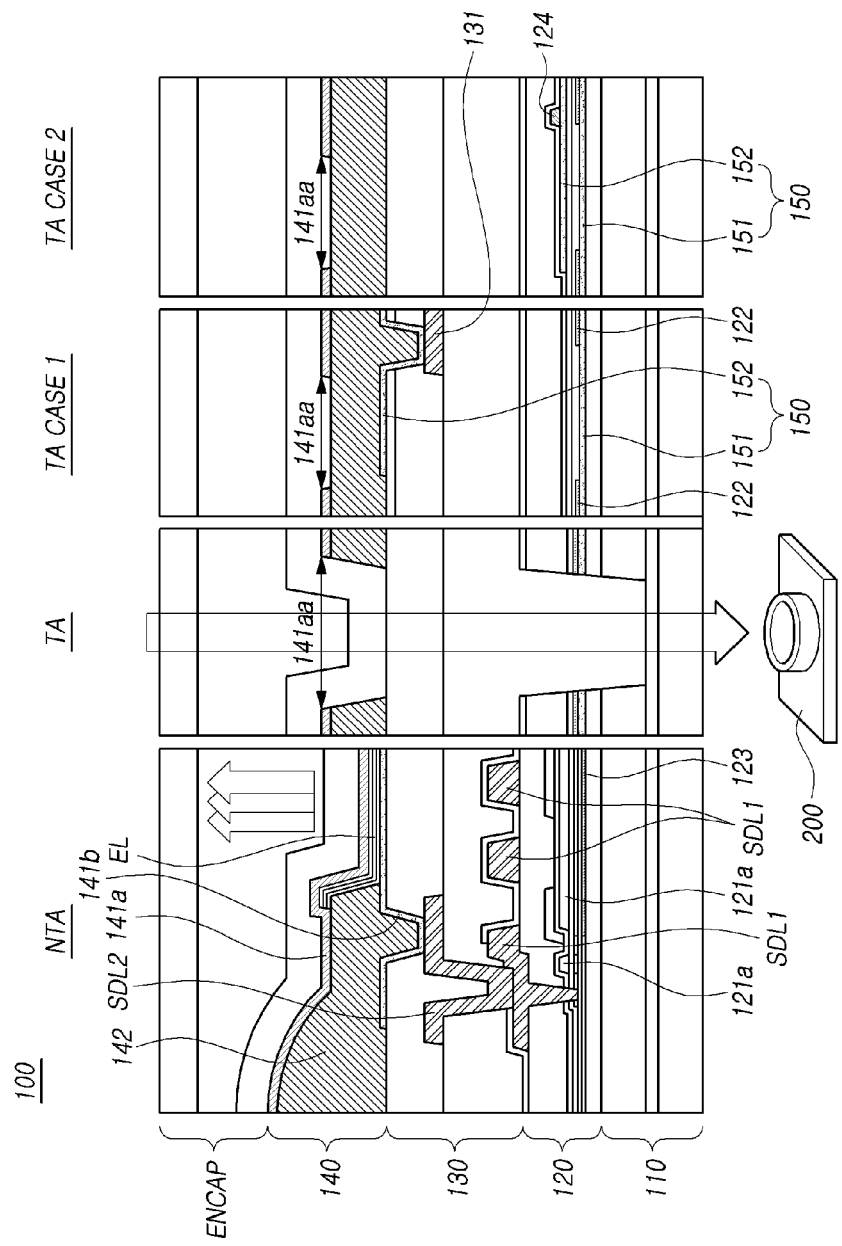
FIG. 7 is a cross-sectional view of a display panel according to embodiments.

FIG. 7 is a cross-sectional view of a display panel according to embodiments of the present disclosure.

FIG. 7 shows a cross-section of the non-transmissive area NTA and a cross-section of the transmissive area TA in the first display area.

A cross section of a portion in which the sub-pixel is positioned in the second display area (not shown in FIG. 7) may be configured to be the same as a cross section of the non-transmissive area NTA in the first display area shown in FIG. 7

FIG. 7 shows a portion in which the light receiving device 200 is located under the substrate 110 in the transmission area TA and a portion in which the antenna 150 is located in the transmission area TA. In particular, in the case where the antenna 150 is located, it is divided into CASE 1 and CASE 2. Although the light receiving device 200 is not positioned below the portion where the antenna 150 is located in FIG. 7, the embodiments in which the light receiving device 200 is located in the transmission area TA where the antenna 150 is located are also included in the embodiments of the present disclosure, and the light receiving device 200 may be positioned to at least partially overlap with the antenna 150.

Referring to FIG. 7, the display panel 100 includes a substrate 110, a transistor layer 120 positioned over the substrate, a planarization layer 130 positioned over the transistor layer, and a light emitting element positioned over the planarization layer, an encapsulation layer ENCAP, and an antenna 150.

The substrate 110 includes a first display area and a second display area each having a plurality of sub-pixels. The number of sub-pixels per unit area in the first display area is less than the number of sub-pixels per unit area in the second display area.

The transistor layer 120 includes a plurality of transistors. In addition to the transistor, the transistor layer 120 may include circuit elements such as a capacitor constituting the sub-pixel circuit described above with reference to FIG. 5.

The transistor layer 120 may include a light blocking layer 123. The light blocking layer 123 may prevent external light from being reflected by the circuit element included in the transistor layer 120 or prevent the circuit element included in the transistor layer 120 from being damaged or altered by external light.

The light blocking layer 123 may be positioned to at least partially overlap the light emitting element.

The planarization layer 130 is a layer for planarizing the transistor layer 120, and may be an organic layer. The type of the organic layer is not particularly limited as long as it can planarize the transistor layer 120, but may be, for example, an optically transparent acrylic resin layer.

The planarization layer 130 may include a first source-drain electrode pattern SDL1 electrically connected to the transistor. The first source-drain electrode pattern SDL1 may be connected to the source-drain of the transistor, or may form another wiring formed over the transistor layer 120.

The planarization layer 130 may include a second source-drain electrode pattern SDL2 connected to the first source-drain electrode pattern SDL1. The second source-drain electrode pattern SDL2 may be a pattern that electrically connects the first source-drain electrode pattern SDL1 of the driving transistor of the transistor layer 120 to the pixel electrode 141b of the light emitting element.

Referring to FIG. 7, the light emitting element layer 140 includes a common electrode 141a and includes a plurality of light emitting elements, wherein a part of the common electrode 141a may be used as an electrode of the light emitting element. The common electrode 141a includes a plurality of holes 141aa in the first display area. The plurality of holes 141aa may be positioned to correspond to the transmission area TA of the first display area. When the plurality of holes 141aa are positioned to correspond to the transmissive area TA of the first display area, transmittance of the transmissive area TA may be further improved, and the light receiving device 200 may efficiently receive light.

The light emitting element layer 140 may include a bank layer 142. The bank layer 142 is a layer having an opening for the pixel electrode 141b, and light-emitting regions of the sub-pixels may be defined by the bank layer 142. The bank layer 142 may be opened in the transmission area TA where the light receiving device 200 is located. When the bank layer 142 is opened in the transmission area TA where the light receiving device 200 is located, the transmission area TA may have higher transmittance.

The planarization layer 130 may be positioned so as not to overlap at least a portion of the plurality of holes 141aa of the common electrode 141a. The planarization layer 130 may include a hole for the light receiving device 200 in order to maximize the transmittance of the transmission area TA.

The antenna 150 is positioned in the first display area and positioned to at least partially overlap the plurality of holes 141aa. By positioning the antenna 150 to at least partially overlap the plurality of holes 141aa, it is possible to prevent the antenna 150 from receiving a signal by the common electrode 141a from being blocked.

The antenna 150 includes a first antenna electrode 151 and a second antenna electrode 152 positioned over the first antenna electrode 151. The antenna 150 may receive a signal by the capacitance of the first antenna electrode 151 and the second antenna electrode 152.

The first antenna electrode 151 is located in the transistor layer 120. When the first antenna electrode 151 is positioned in the transistor layer 120, the first antenna electrode 151 may be formed before the light emitting element layer 140 is formed. Therefore, since it is not necessary to form the antenna electrode at a low temperature to prevent damage to the light emitting element after forming the light emitting element, it is possible to prevent a defect from occurring in the first antenna electrode 151.

The first antenna electrode 151 may be made of a transparent conductive material. For example, the first antenna electrode may be made of indium tin oxide (ITO) or indium gallium zinc oxide (IGZO), but is not limited thereto. Accordingly, external light may be smoothly incident on the light receiving device 200 even when the light receiving device 200 overlaps the antenna 150.

The transistor layer 120 may include a first opaque conductive layer 122 positioned in the first display area.

The first opaque conductive layer 122 may be formed of the same material as the light blocking layer 123. When the first opaque conductive layer 122 is formed of the same material as the light blocking layer 123, the first opaque conductive layer 122 may be formed by the same process as the light blocking layer 123, so that the manufacturing cost of the display panel can be reduced.

The first opaque conductive layer 122 may not overlap the plurality of holes 141aa. Since the first opaque conductive layer 122 does not overlap the plurality of holes 141aa, transmittance of a portion in which the holes are located may be further improved.

The first antenna electrode 151 may contact the first opaque conductive layer 122 in the first display area. The first opaque conductive layer 122 may be electrically connected to the first antenna electrode 151 so that the antenna 150 can better detect a received signal.

The light emitting element layer 140 may include a pixel electrode 141b positioned below the common electrode 141a.

Referring to TA CASE 1 of FIG. 7, the second antenna electrode 152 is positioned in the light emitting element layer 140 and may be formed of the same material as the pixel electrode 141b. When the second antenna electrode 152 is made of the same material as the pixel electrode 141b, the second antenna electrode 152 can be formed while forming the pixel electrode 141b of the light emitting element layer 140, and thus the manufacturing cost of the display panel can be reduced.

The planarization layer 130 may include a second opaque conductive layer 131 positioned in the first display area.

The second opaque conductive layer 131 may not overlap the plurality of holes 141aa. When the second opaque conductive layer 131 does not overlap the plurality of holes 141aa, transmittance of a region in which the common electrode 141a is opened by the holes 141aa may be further improved.

The second antenna electrode 152 may contact the second opaque conductive layer 131 in the first display area. When the second opaque conductive layer 131 is in contact with the second antenna electrode 152, the resistance of the second antenna electrode 152 may be reduced so that the antenna 150 may better receive a signal.

The second opaque conductive layer 131 may be formed of the same material as the second source-drain electrode pattern SDL2. When the second opaque conductive layer 131 is formed of the same material as the second source-drain electrode pattern SDL2, the second source-drain electrode pattern SDL2 and the second opaque conductive layer 131 are formed by the same process, so that the second opaque conductive layer 131 can be formed without an additional process.

Referring to TA CASE 2 of FIG. 7, the second antenna electrode 152 may be positioned in the transistor layer 120. When the second antenna electrode 152 is positioned in the transistor layer 120, the second antenna electrode 152 can be formed through a process of forming signal wiring or circuit elements positioned over the transistor layer 120, so that the second antenna electrode 152 may be formed without an additional process.

The second antenna electrode 152 may be made of the same material as the first antenna electrode 151. That is, both the first and second antenna electrodes 151 and 152 of TA Case 2 of FIG. 7 may be made of a transparent conductive material. In this case, in TA case 2 of FIG. 7, external light may be more smoothly incident on the light receiving device 200 than in TA case 1.

In addition, when the second antenna electrode 152 is positioned in the transistor layer 120, since both the first antenna electrode 151 and the second antenna electrode 152 are positioned in the transistor layer 120, the distance between the antenna electrodes becomes shorter than TA CASE 1, the capacitance of the antenna may increase, and the performance of the antenna may be improved.

The transistor layer 120 may include a third opaque conductive layer 124 positioned in the first display area. The third opaque conductive layer 124 may be formed of the same material as one of wirings and circuit elements disposed in the transistor layer 120. For example, the third opaque conductive layer 124 may be formed of the same material as the gate 121a included in the transistor positioned in the transistor layer 120.

The third opaque conductive layer 124 does not overlap the plurality of holes 141aa. When the third opaque conductive layer 124 does not overlap the plurality of holes 141aa, the transparent region in which the common electrode 141a is open may have higher transmittance.

The second antenna electrode 152 may be in contact with the third opaque conductive layer 124 in the first display area. When the second antenna electrode 152 is electrically connected to the third opaque conductive layer 124, the resistance of the second antenna electrode 152 may be reduced so that the antenna 150 may better receive a signal.

Figure 8:
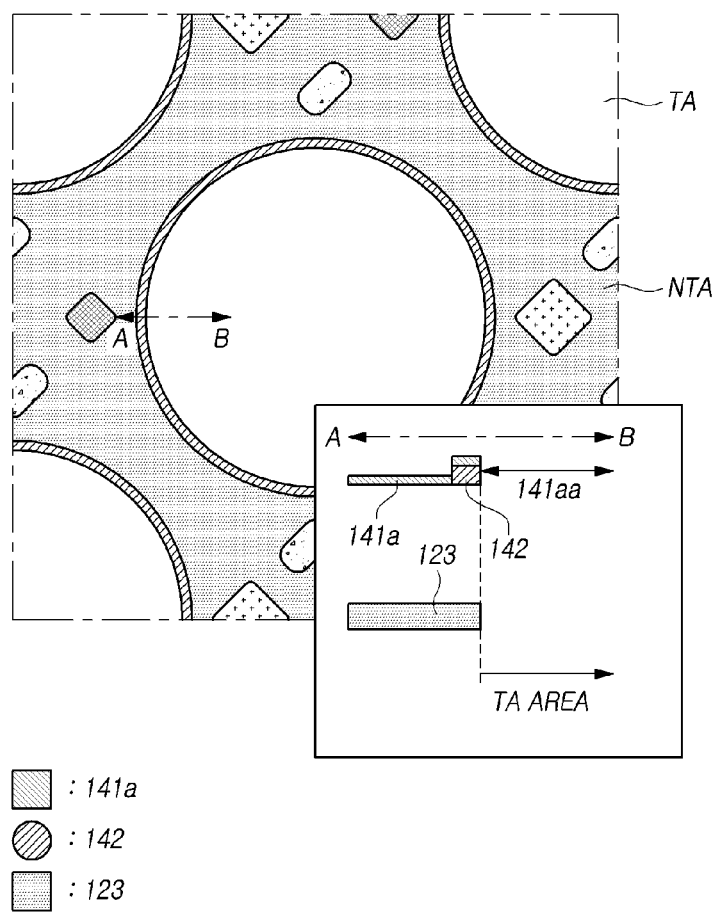
FIG. 8 is a top view of a display panel according to a comparative example of the present disclosure.

FIG. 8 is a top view of a display panel according to a comparative example of the present disclosure.

Referring to FIG. 8, the light-emitting regions of the sub-pixel are located in the non-transmissive area NTA, and the light blocking layer 123 may be located in the non-transmissive area NTA.

In the first display area, the common electrode 141a includes a hole 141aa corresponding to the transmission area TA. Accordingly, since the common electrode 141a is opened in the transmissive area TA, the transmissive area TA has higher transmittance, and the light receiving device positioned in the transmissive area TA may receive light efficiently.

The bank layer 142 may be positioned at the periphery of the hole 141aa of the common electrode 141a. The bank layer 142 is located under the common electrode 141a and may serve as a guide in the process of forming the hole 141aa in the common electrode 141a.

Figure 9:
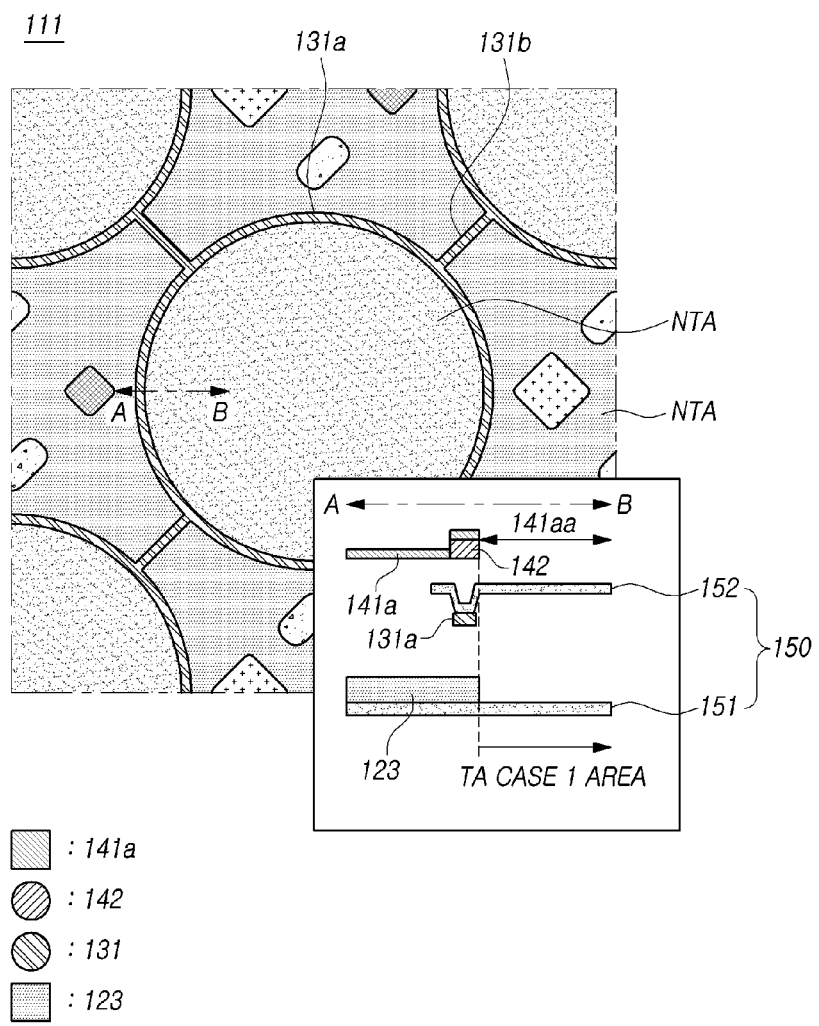
FIGS. 9 and 10 are top views of a display panel according to embodiments of the present disclosure.

FIG. 9 is a top view and a partial cross-sectional view of a first display area according to embodiments of the present disclosure.

FIG. 9 is a top view and a cross-sectional view of a region corresponding to TA CASE 1 of FIG. 7

Referring to FIG. 9, in the first display area, the common electrode 141a includes a hole 141aa corresponding to the transmission area TA. Accordingly, since the common electrode 141a is opened in the transmissive area TA, the transmissive area TA has higher transmittance, and the light receiving device positioned in the transmissive area TA may receive light efficiently.

The bank layer 142 may be positioned at a periphery of the hole 141aa of the common electrode 141a. The bank layer 142 is located under the common electrode 141a and may serve as a guide in the process of forming the hole 141aa in the common electrode 141a.

The second opaque conductive layer 131 may be in contact with the second antenna electrode 152. The second opaque conductive layer 131 may include a first portion 131a and a second portion 131b. The first portion 131a may be a portion corresponding to the edges of the plurality of holes 141aa in the first display area. The first portion 131a may be a part of the second opaque conductive layer 131 in contact with the second antenna electrode 152 in the first display area.

A bank layer 142 may be positioned at a periphery of the hole 141aa of the common electrode 141a. The bank layer 142 is located under the common electrode 141a and may serve as a guide in the process of forming the hole 141aa in the common electrode 141a.

The second part 131b may connect the first parts 131a. As the second opaque conductive layer 131 is disposed as shown in FIG. 9, the second opaque conductive layer 131 may contact the antenna 150 in the first display area.

Figure 10:
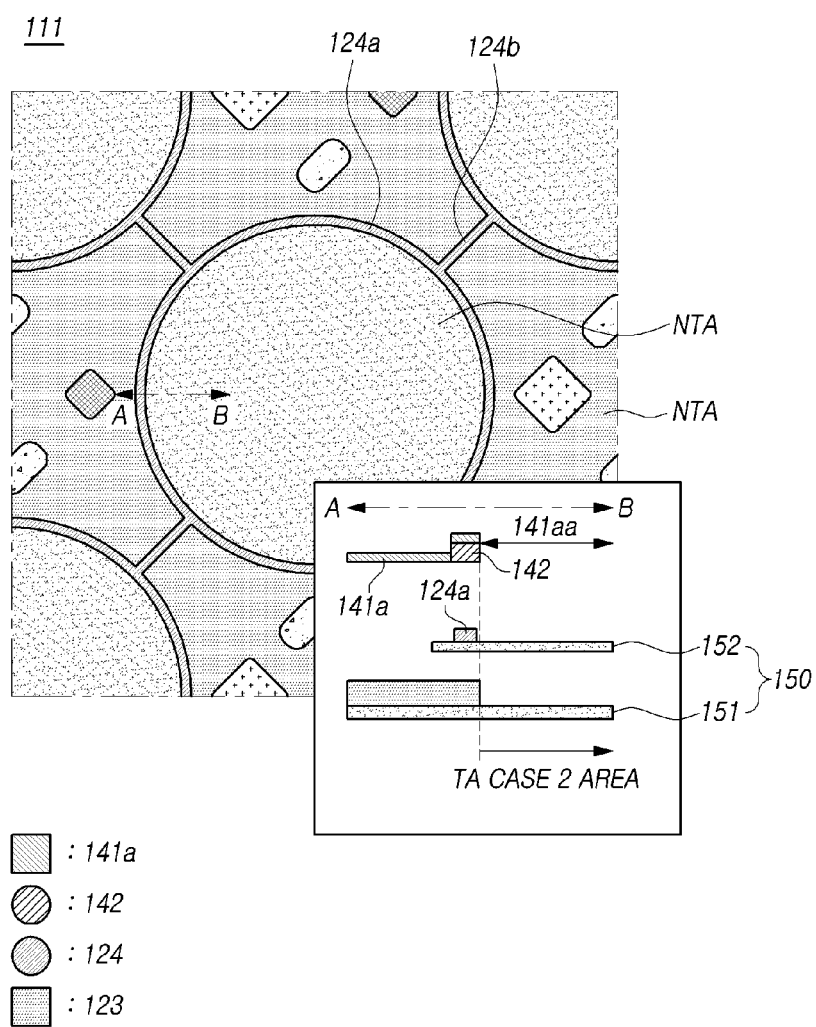

FIG. 10 is a top view and a partial cross-sectional view of a first display area according to embodiments of the present disclosure.

FIG. 10 is a top view and a cross-sectional view of a region corresponding to TA CASE 2 of FIG. 7.

Referring to FIG. 10, the common electrode 141a in the first display area includes a hole 141aa corresponding to the transmission area TA. Accordingly, since the common electrode 141a is opened in the transmissive area TA, the transmissive area TA has higher transmittance, and the light receiving device positioned in the transmissive area TA may efficiently receive light.

A bank layer 142 may be positioned at the periphery of the hole 141aa of the common electrode 141a. The bank layer 142 is located under the common electrode 141a and may serve as a guide in the process of forming the hole 141aa in the common electrode 141a.

The third opaque conductive layer 124 may include a third portion 124a corresponding to the edges of the plurality of holes 141aa and a fourth portion 124b connecting the third portions. The third portion 124a may be a portion corresponding to the edges of the plurality of holes 141aa in the first display area. The third portion 124a may be a part of the third opaque conductive layer 124 in contact with the second antenna electrode 152 in the first display area.

The fourth part 124b may connect the third parts 124a. As the third opaque conductive layer 124 is disposed as shown in FIG. 10, the third opaque conductive layer 124 may contact the antenna 150 in the first display area.

In another aspect, embodiments of the present disclosure may provide a display device including a display panel and a light receiving device.

In the display device according to the embodiments of the present disclosure, the details of the display panel are the same as those of the display panel according to the embodiments of the present disclosure described above, and thus will be omitted.

What is claimed is:

1. A display panel comprising:
    a substrate including a first display area and a second display area each having a plurality of sub-pixels, wherein the number of sub-pixels per unit area in the first display area is less than the number of sub-pixels per unit area in the second display area;
    a transistor layer disposed over the substrate and including a plurality of transistors;
    a planarization layer over the transistor layer;
    a light emitting element layer including a common electrode including a plurality of holes in the first display area, disposed over the planarization layer, and including a plurality of light emitting elements; and
    an antenna comprising a first antenna electrode disposed in the transistor layer and a second antenna electrode disposed over the first antenna electrode, disposed in the first display area and at least a part of which overlaps the plurality of holes.

2. The display panel of claim 1,
    wherein the transistor layer comprises a first opaque conductive layer positioned in the first display area, the first opaque conductive layer not overlapping with the plurality of holes, and
    wherein the first antenna electrode is in contact with the first opaque conductive layer in the first display area.

3. The display panel of claim 2,
    wherein the transistor layer comprises a light blocking layer positioned to at least partially overlap the light emitting element, and
    wherein the first opaque conductive layer is formed of the same material as the light blocking layer.

4. The display panel of claim 1,
    wherein the light emitting element layer comprises a pixel electrode located under the common electrode, and
    wherein the second antenna electrode is disposed in the light emitting element layer and is formed of the same material as the pixel electrode.

5. The display panel of claim 4,
    wherein the planarization layer comprises a second opaque conductive layer positioned in the first display area, the second opaque conductive layer not overlapping with the plurality of holes, and
    wherein the second antenna electrode is in contact with the second opaque conductive layer in the first display area.

6. The display panel of claim 5,
    wherein the planarization layer comprises a source-drain electrode pattern electrically connected to the transistor, and
    wherein the second opaque conductive layer is formed of the same material as the source-drain electrode pattern.

7. The display panel of claim 5,
    wherein the second opaque conductive layer comprises a first portion corresponding to an edge of the plurality of holes in the first display area and a second portion connecting the first portions.

8. The display panel of claim 1, wherein the second antenna electrode is disposed in the transistor layer.

9. The display panel of claim 8,
    wherein the transistor layer comprises a third opaque conductive layer positioned in the first display area, the third opaque conductive layer not overlapping with the plurality of holes, and
    wherein the second antenna electrode is in contact with the third opaque conductive layer in the first display area.

10. The display panel of claim 9,
    wherein the plurality of transistors comprise a gate, and
    wherein the third opaque conductive layer is formed of the same material as the gate.

11. The display panel of claim 8,
    wherein the third opaque conductive layer comprises a third portion corresponding to the edge of the plurality of holes, and a fourth portion connecting the third portions.

12. A display device comprising a display panel and a light receiving device,
    wherein the display panel comprises:
        a substrate including a first display area and a second display area each having a plurality of sub-pixels, wherein the number of sub-pixels per unit area in the first display area is less than the number of sub-pixels per unit area in the second display area;
        a transistor layer disposed over the substrate and including a plurality of transistors;
        a planarization layer over the transistor layer;
        a light emitting element layer including a common electrode including a plurality of holes in the first display area, disposed over the planarization layer, and including a plurality of light emitting elements; and
        an antenna comprising a first antenna electrode disposed in the transistor layer and a second antenna electrode disposed over the first antenna electrode, disposed in the first display area and at least a part of which overlaps the plurality of holes,
    wherein the light receiving device is located under the substrate and at least partially overlaps the first display area.

13. The display device of claim 12, wherein the light receiving device is positioned to at least partially overlap with the antenna.

14. The display device of claim 12, wherein the light receiving device is not exposed from a front side of the display device.

* * * * *